(12) United States Patent
Pons

(10) Patent No.: US 10,303,192 B2
(45) Date of Patent: May 28, 2019

(54) LOW DROP OUT REGULATOR COMPATIBLE WITH TYPE C USB STANDARD

(71) Applicant: STMicroelectronics (Alps) SAS, Grenoble (FR)

(72) Inventor: Alexandre Pons, Vizille (FR)

(73) Assignee: STMicroelectronics (Alps) SAS, Grenoble (FR)

( * ) Notice: Subject to any disclaimer, the term of this patent is extended or adjusted under 35 U.S.C. 154(b) by 206 days.

(21) Appl. No.: 15/364,392

(22) Filed: Nov. 30, 2016

(65) Prior Publication Data

US 2017/0336819 A1 Nov. 23, 2017

(30) Foreign Application Priority Data

May 23, 2016 (FR) ..................... 16 54576

(51) Int. Cl.

| | |
|---|---|
| H02J 7/00 | (2006.01) |
| G05F 1/59 | (2006.01) |
| G05F 1/56 | (2006.01) |
| G05F 1/569 | (2006.01) |
| H01R 24/60 | (2011.01) |
| H02J 7/02 | (2016.01) |
| H02J 7/06 | (2006.01) |
| H03F 3/45 | (2006.01) |

(Continued)

(52) U.S. Cl.
CPC .............. *G05F 1/59* (2013.01); *G05F 1/56* (2013.01); *G05F 1/569* (2013.01); *H01R 24/60* (2013.01); *H02J 7/022* (2013.01); *H02J 7/06* (2013.01); *H03F 3/45071* (2013.01); *H01R 2107/00* (2013.01); *H02J 2007/10* (2013.01); *H03F 2203/45521* (2013.01); *H03F 2203/45641* (2013.01)

(58) Field of Classification Search
CPC ................................... H02J 7/06; H02J 7/022
USPC ......................................................... 320/107
See application file for complete search history.

(56) References Cited

U.S. PATENT DOCUMENTS

| | | | |
|---|---|---|---|
| 6,002,295 A | 12/1999 | Gens et al. | |
| 6,177,783 B1 | 1/2001 | Donohue | |

(Continued)

FOREIGN PATENT DOCUMENTS

| | | |
|---|---|---|
| CN | 104837091 A | 8/2015 |
| CN | 206460351 U | 9/2017 |

(Continued)

*Primary Examiner* — Suchin Parihar
(74) *Attorney, Agent, or Firm* — Slater Matsil, LLP

(57) ABSTRACT

A low dropout voltage regulator unit includes an error amplifier and a power stage having an output terminal that is looped back onto the error amplifier and is capable of delivering an output current to a load. The unit includes multiple main supply inputs that are intended to potentially receive, respectively, multiple different supply voltages. The power stage includes multiple power paths that are connected, respectively, between the main supply inputs and the output terminal, are individually selectable and each comprise an output transistor. The unit also includes a selector circuit connected to the main supply inputs and configured to select one of the power paths according to a selection criterion. The error amplifier includes an output stage configured to selectively control the output transistor of the selected power path.

21 Claims, 5 Drawing Sheets

(51) Int. Cl.
*H01R 107/00* (2006.01)
*H02J 7/10* (2006.01)

(56) References Cited

U.S. PATENT DOCUMENTS

| | | | |
|---|---|---|---|
| 2010/0060078 A1 | 3/2010 | Shaw | |
| 2015/0229161 A1 | 8/2015 | Talmola et al. | |
| 2016/0336762 A1* | 11/2016 | Hunter | H02J 7/007 |
| 2017/0220090 A1* | 8/2017 | Kim | G06F 1/266 |
| 2018/0026636 A1* | 1/2018 | Birkner | H03K 17/687 |
| | | | 326/39 |
| 2018/0067885 A1* | 3/2018 | Hsieh | G06F 1/22 |
| 2018/0159341 A1* | 6/2018 | Kadam | H02J 7/0045 |

FOREIGN PATENT DOCUMENTS

| | | |
|---|---|---|
| EP | 0838745 A1 | 4/2008 |
| EP | 2905859 A1 | 8/2015 |

* cited by examiner

| VIN1_OK | VIN2_OK | VIN3_OK | SEL1 | SEL2 | SEL3 | mode |
|---------|---------|---------|------|------|------|------|
| 0 | 0 | 0 | 0 | 0 | 0 | starting phase |
| X | 0 | 1 | 0 | 0 | 1 | VAUX selected |
| X | 1 | X | 0 | 1 | 0 | VBAT selected |
| 1 | 0 | 0 | 1 | 0 | 0 | VBUS selected |

LOW DROP OUT REGULATOR COMPATIBLE WITH TYPE C USB STANDARD

CROSS-REFERENCE TO RELATED APPLICATIONS

This application claims priority to French Application No. 1654576, filed on May 23, 2016, which application is hereby incorporated herein by reference.

TECHNICAL FIELD

Embodiments of the invention relate to low dropout voltage regulator units (LDOs) and in particular those compatible with the USB Type-C standard.

BACKGROUND

The USB Type-C standard is a new USB standard offering new features, namely, in particular, a reversible orientation of the USB connector and direction of the USB cable. Additionally, the USB cable can withstand high powers in charging applications, being capable of reaching up to 60 watts for example, which involves high supply voltages, typically from 5 volts to 20 volts. That being so, other, lower supply voltages are also possible, for example from 2.7 volts to 5.5 volts.

Type-C controllers are used in order to manage the detection of the USB cable (connection and type), the communication protocol, and the various supply voltages.

Identical Type-C controllers may be located inside the source (the supply block, typically a battery charger that is connected to the mains) but also inside the object that consumes the power (a mobile telephone, a laptop computer, a tablet, etc.) or even inside the connectors of the USB cables, for example.

However, the supply voltages present in these various locations generally have different values.

SUMMARY

According to one embodiment, an integrated low dropout voltage regulator, capable of being supplied by multiple supply sources so as to generate a fixed supply voltage for the controller, is therefore proposed.

According to one embodiment, the implementation of a regulator of this type with a reduced footprint and using a power PMOS transistor only when the high supply voltage is selected, and using conventional PMOS transistors for the other supply voltages, is proposed.

According to one aspect, a low dropout voltage regulator unit, comprising an error amplifier and a power stage having an output terminal that is looped back onto the error amplifier and capable of delivering an output current to a load, is thus proposed.

According to a general feature of this aspect, the regulator unit comprises multiple main supply inputs that are intended to potentially receive, respectively, multiple different supply voltages.

The power stage comprises multiple power paths that are connected, respectively, between the main supply inputs and the output terminal, are individually selectable and each comprise an output transistor (or "gain" transistor).

The term "multiple" is understood to mean "at least two".

The regulator unit additionally comprises a selector circuit connected to the main supply inputs and configured to select one of the power paths according to a selection criterion.

The error amplifier additionally comprises an output stage (comprising, for example, a "small-signal" gain stage) configured to selectively control the output transistor of the selected power path.

According to one embodiment, the error amplifier comprises an input stage having an input that is coupled to the output terminal and the output stage comprises multiple modules that are assigned, respectively, to the power path, each module being coupled to the output of the input stage, to the main supply input that is connected to the corresponding power path, and configured to control or not to control the output transistor of the corresponding power path at the command of the selector circuit.

According to one embodiment, each module comprises: a module input coupled to the output of the input stage of the error amplifier; a module output coupled to the gate of the corresponding output transistor; a module supply input coupled to the corresponding main supply input; and a gain stage connected between the module supply input and ground and comprising a module transistor, connected between the module output and ground, whose gate is connected to the module input and to ground via, respectively, two switches that are controllable, respectively, by two additional control signals delivered by the selector circuit.

Each module advantageously comprises a Miller compensator circuit, connected between the drain and the gate of the module transistor.

According to one embodiment, the selector circuit is supplied with the output voltage present at the output terminal and the regulator unit has a starting configuration in which each power path, connected to a supply voltage that is actually present, is on until the output voltage reaches a threshold value allowing the selector circuit to select one of the power paths.

Additionally, each module of the output stage of the error amplifier is advantageously configured, in the starting configuration, to turn on the corresponding output transistor.

Each output transistor is, for example, a PMOS transistor having its substrate connected to the corresponding main supply input and each module advantageously comprises a pull-down circuit connected between the module output and ground and having a control input connected to the output terminal.

This pull-down circuit comprises, for example, a first NMOS transistor connected between the module output and ground, a resistor connected between the module supply input and the gate of the first transistor, and a second NMOS transistor connected between the gate of the first transistor and ground, whose gate is connected to the output terminal.

According to one embodiment, each power path comprises a circuit that is controllable by the selector circuit, configured to allow the power path to be selected or not to be selected and to turn the power path on during the starting phase.

This controllable circuit comprises, for example, an auxiliary PMOS transistor connected as a diode, connected between the output transistor and the output terminal, and controllable on its gate via a drive transistor that is itself controllable on its gate by the selector circuit.

This auxiliary PMOS transistor additionally advantageously has its substrate connected to the output terminal and its gate connected to the output terminal via a resistor.

According to one embodiment, the selector circuit comprises multiple detector circuits that are coupled, respectively, to the main supply inputs and each configured to detect the crossing of a threshold by the corresponding supply voltage and to deliver a detection logic signal that is representative of the crossing or non-crossing of the threshold.

The selector circuit additionally comprises a logic module configured to receive the detection logic signals and to deliver a selection signal that is representative of the power path selected according to the selection criterion.

This selection criterion may advantageously correspond to the supply voltage present that has the lowest value.

The error amplifier could be supplied with a separate supply voltage, but it is particularly advantageous for it to be supplied with the supply voltage delivered to the output terminal of the regulator unit.

Stated otherwise, the input stage of the error amplifier has a supply input that is advantageously connected to the output terminal.

At least one of the output transistors is advantageously a specifically "high-voltage"-compatible transistor, e.g., a power transistor, so as to be able to withstand a high supply voltage.

According to another aspect, a controller, which is compatible with the USB Type-C standard that incorporates a low dropout voltage regulator unit such as defined above, is proposed.

According to another aspect, a device, e.g., a laptop computer, or even a wireless communication device such as e.g., a cellular mobile telephone or a tablet, incorporating a controller such as defined above, is proposed.

According to another aspect, a DC supply source charger, e.g., a battery charger, incorporating a controller such as defined above, is proposed.

According to another aspect, a USB Type-C cable, incorporating a controller such as defined above, is also proposed.

BRIEF DESCRIPTION OF THE DRAWINGS

Other advantages and features of the invention will become apparent upon examining the detailed description of completely non-limiting embodiments and the appended drawings, in which.

DETAILED DESCRIPTION OF ILLUSTRATIVE EMBODIMENTS

Figure 1:
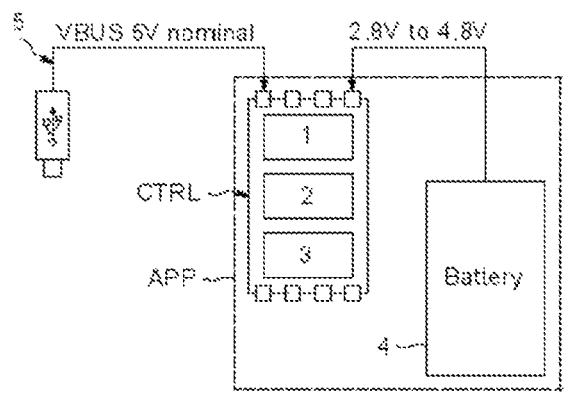
FIG. 1 illustrates a controller incorporated in an electronic device.
Figure 2:
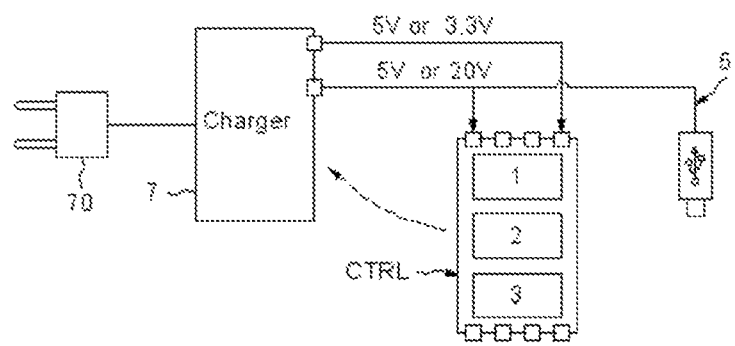
FIG. 2 illustrates a controller integrated in a charger.
Figure 3:
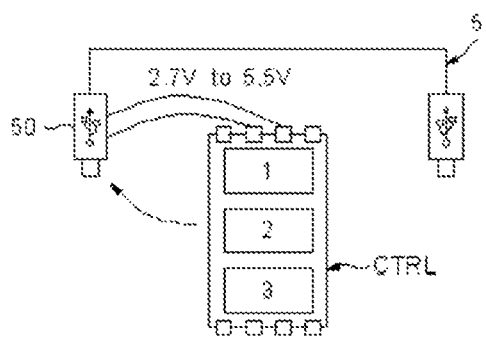
FIG. 3 illustrates a controller positioned in a cable.

In FIGS. 1 to 3, the reference CTRL denotes a USB controller that is compatible with the USB Type-C standard, comprising one, or typically multiple, low dropout voltage regulator(s) 1 (LDO) that are intended to deliver a fixed regulated voltage to an analog front-end module (AFE) 2 of conventional structure and known per se, as well as to a digital core 3. In this context, "USB Type-C standard" means any USB Type-C standard that has been finalized as of the effective filing date of this patent.

In the embodiment of FIG. 1, the controller CTRL is positioned in a device APP, e.g., a laptop computer or else a wireless communication device such as a cellular mobile telephone, or even a tablet computer.

In this example, the controller may be supplied either with a high voltage VBUS delivered by a USB Type-C cable denoted by 5, having, for example, a nominal level of 5 volts but typically being capable of varying from 5 volts to 20 volts, or else with a voltage VBAT delivered by a DC supply source 4, e.g., a battery, this voltage VBAT being capable, for example, of varying between 2.8 volts and 4.8 volts.

In the embodiment of FIG. 2, the controller CTRL is incorporated in a charger 7, e.g., a battery charger, having a plug 70 that is intended to be connected to the mains. The charger 7 is, for example, configured to supply the regulator 1 with a high voltage VBUS (from 5 volts to 20 volts) which could be conveyed over the USB cable 5, or else with an auxiliary voltage whose level may be, for example, 5 volts or 3.3 volts.

In the embodiment of FIG. 3, the controller CTRL is positioned in the USB cable 5, and more particularly in each connector 50, and may then be supplied with an auxiliary voltage originating from a first pin of the connector (e.g., the pin standardized under the designation CC1) or with another auxiliary voltage originating from a second pin of the connector (e.g., the pin standardized under the designation CC2), whose levels may vary from 2.7 volts to 5.5 volts, for example.

It is therefore seen that the low dropout voltage regulator 1 must be capable of delivering a fixed regulated voltage to the various elements of the controller CTRL regardless of the value of the supply voltage of the regulator that may originate from multiple different supply sources.

The regulator 1 incorporated in the controller CTRL is therefore a low dropout voltage regulator that may be supplied by multiple supply sources in order to generate a fixed regulated voltage as output.

One embodiment and one example of operation of such a regulator 1 will now, more particularly, be described with reference to FIGS. 4 to 10.

Figure 4:
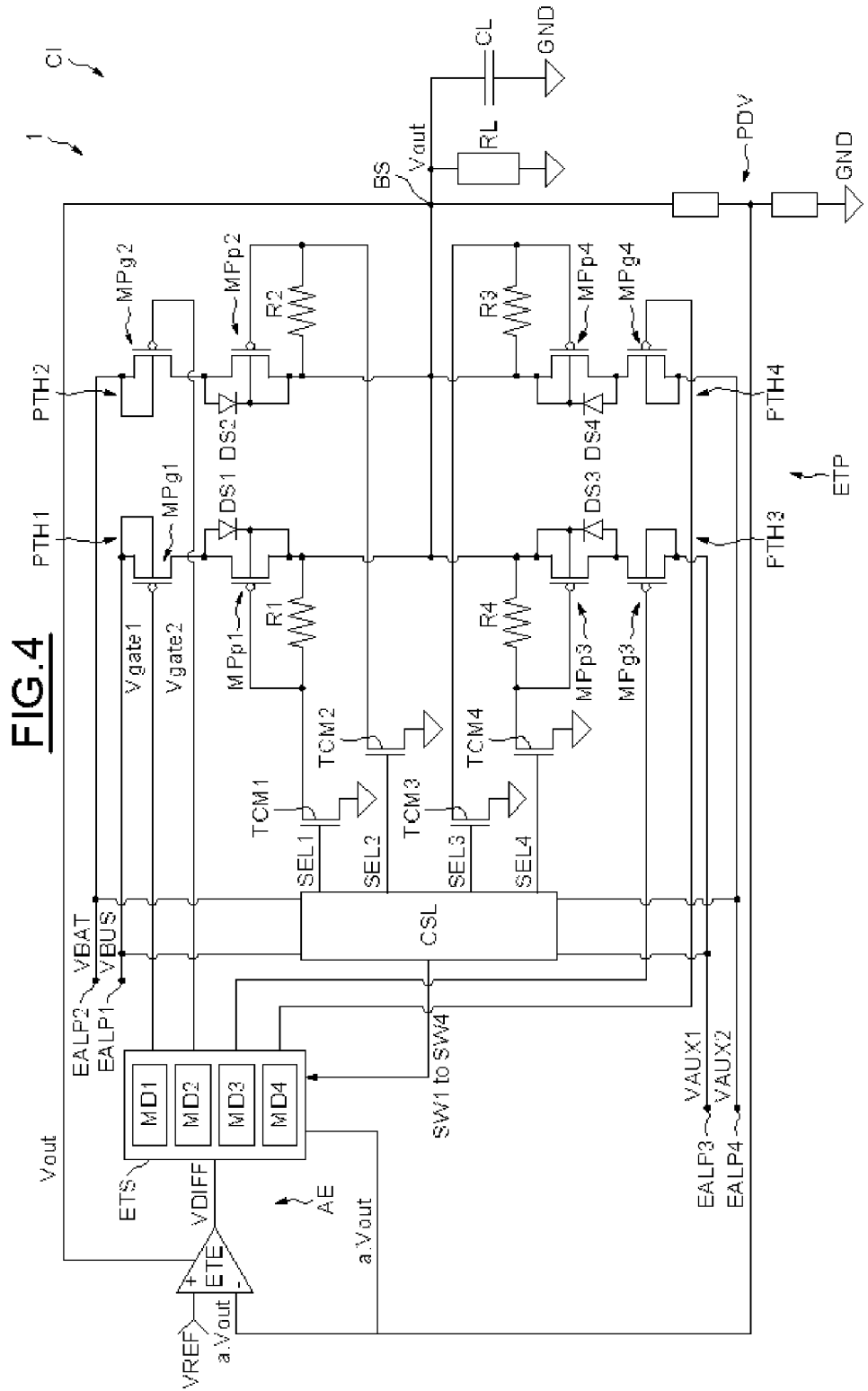
FIG. 4 illustrates a circuit diagram of a regulator of an embodiment of the invention.

Referring now, more particularly, to FIG. 4, it is seen that the regulator 1, produced, for example, so as to be integrated within an integrated circuit CI, comprises an error amplifier AE receiving a reference voltage VREF arising from a reference voltage source, e.g., a band-gap reference voltage source, which is a substantially temperature-independent voltage and which delivers a voltage of around 1.25 volts, close to the value of the band gap of silicon at a temperature of 0 K, which is equal to 1.22 electronvolts.

The regulator 1 also comprises a power stage ETP having an output terminal BS that is looped back onto the error amplifier via a divider bridge PDV (although this divider bridge is not absolutely essential) so as to deliver, to the inverting input of the error amplifier, a voltage that is equal to a.Vout, where Vout is the output voltage delivered to the output terminal of the regulator and has the division ratio of the divider bridge PDV.

The output voltage Vout is a regulated voltage, i.e., independent of variations in the supply voltage, which, in the present case, may be one of the voltages VBUS, VBAT, VAUX1 and VAUX2 that are liable to be available.

For stability reasons, the regulator 1 may be connected to a decoupling capacitor CL. Additionally in FIG. 4, the reference RL represents the load of the regulator, which may be, for example, the analogue front-end module (AFE) 2 or the digital core 3 (FIGS. 1 to 3).

In this embodiment, the regulator 1 therefore comprises four main supply inputs EALP1-EALP4 that are intended to potentially receive, respectively, multiple different supply voltages, in this case the voltages VBUS, VBAT, VAUX1 and VAUX2.

As will be shown in more detail below, it is possible for only one of these supply voltages to be present, or else multiple supply voltages may be simultaneously present.

The voltage VBUS in this case is a high voltage that is typically capable of varying from 5 volts to 20 volts, while the voltage VBAT is a low voltage that is capable of varying, for example, from 2.8 volts to 4.8 volts and the voltages VAUX1 and VAUX2 are medium voltages that are capable of varying, for example, from 2.7 volts to 5.5 volts.

The power stage ETP of the regulator 1 comprises multiple power paths, at least two and in this case four power paths PTH1-PTH4 connected, respectively, between the main supply inputs EALP1-EALP4 and the output terminal BS.

These power paths PTH1-PTH4 are individually selectable and each comprises an output transistor MPgi (i varying from 1 to 4).

The regulator 1 additionally comprises a selector circuit CSL connected to the main supply inputs EALP1-EALP4 and configured to select one of the power paths PTH1-PTH4 according to a selection criterion, an example of which will be given below.

Lastly, the error amplifier AE comprises, aside from the input stage ETE receiving the reference voltage VREF and the voltage a.Vout, an output stage ETS configured to selectively control the output transistor MPgi of the selected power path PTHi.

FIGS. 5 to 8 are now more particularly referred to in order to describe the various elements of this regulator 1 in greater detail.

Figure 5:
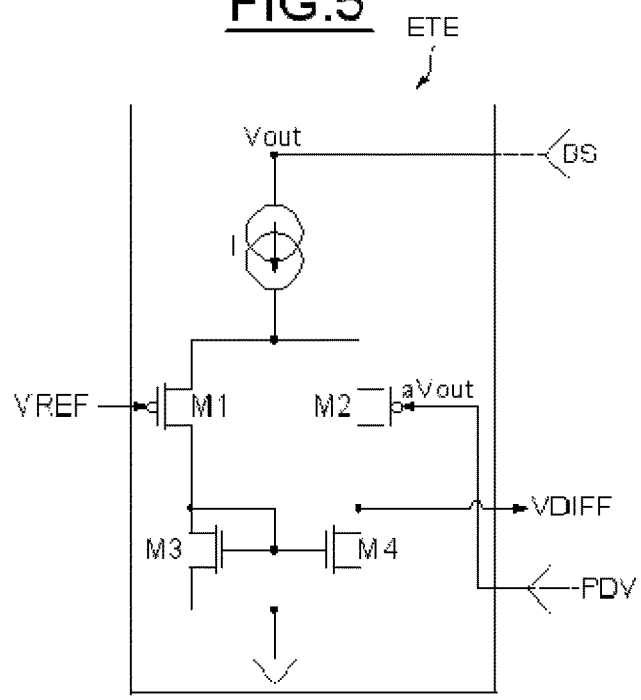
FIG. 5 illustrates an input stage of a regulator of an embodiment of the invention.

Referring now, more particularly, to FIG. 5, it is seen that the input stage ETE of this regulator may be implemented, in the conventional manner, by a differential pair biased by a current source I that is supplied with the voltage Vout delivered to the output terminal BS of the regulator.

The differential pair is connected to a current mirror.

The differential pair comprises two PMOS transistors M1 and M2 that are connected by their source.

The current mirror is formed by two transistors M3 and M4 that are connected by their gates and are, for example, NMOS transistors. The sources of the transistors M3 and M4 are connected, respectively, to the drains of the transistors M1 and M2 of the differential pair.

The gate of the transistor M1 corresponds to the positive input of the error amplifier AE and therefore receives the reference voltage VREF.

The gate of the transistor M2 corresponds to the inverting input of the amplifier and receives the voltage a.Vout.

The drain of the transistor M2 forms the output of this input stage ETE and delivers a voltage VDIFF.

The output stage ETS comprises multiple modules, in this case four modules MD1-MD4 (FIG. 4) that are assigned, respectively, to the power paths PTH1-PTH4.

Each module MDi is coupled to the output of the input stage of the error amplifier AE and is also coupled to the main supply input EALPi that is connected to the corresponding power path PTHi.

Each module is configured to control or not to control the output transistor MPgi of the corresponding power path PTHi at the command of the selector circuit CSL.

Figure 6:
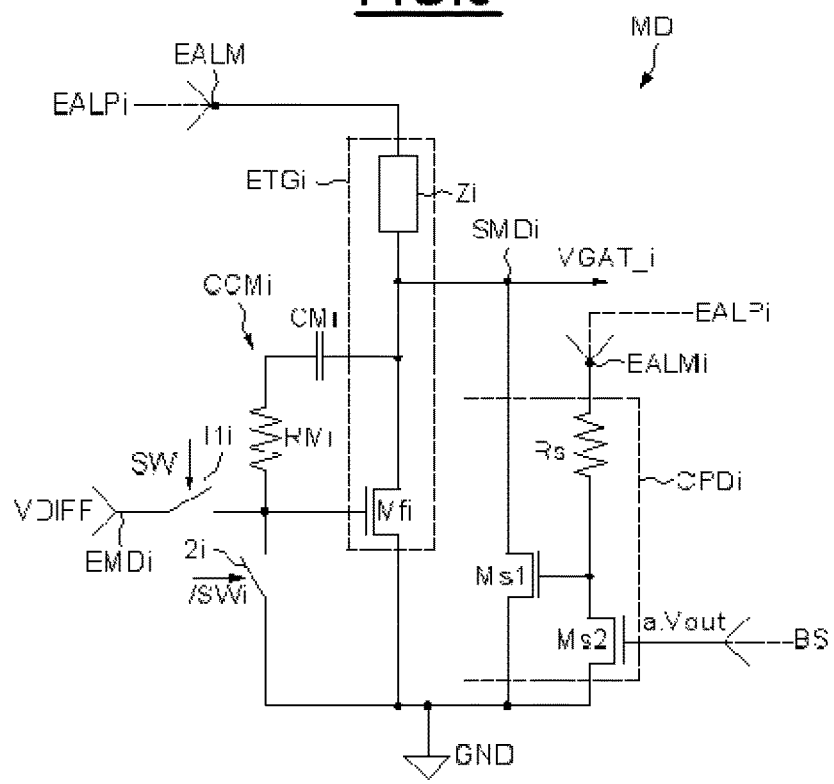
FIG. 6 illustrates an exemplary embodiment in further detail.

FIG. 6 is now more particularly referred to in order to describe one exemplary embodiment of a module MDi in greater detail.

The architecture of all of the modules MDi is identical. Only the values of certain components change in order to adapt, in particular, to the characteristics of the corresponding output transistor.

Each module MDi comprises a module input EMDi coupled to the output of the input stage ETE of the error amplifier AE in order to receive the voltage VDIFF.

The module MDi also comprises a module output SMDi coupled to the gate of the corresponding output transistor MPgi. The module output SMDi delivers the signal Vgate_i.

The module MDi comprises a module supply input EALMi coupled to the corresponding main supply input EALPi.

The module MDi additionally comprises a gain stage in common-source configuration ETGi, connected between the module supply input EALMi and ground GND.

This (small-signal) gain stage comprises a module transistor Mfi, in this case an NMOS transistor, connected between the module output SMDi and ground GND. The gate of this module transistor Mfi is connected to the module input EMDi via a first switch I1$i$ that is controlled by a control signal SWi.

The gate of the module transistor Mfi is also connected to ground GND via a second switch I2$i$ that is controlled by a control signal/SWi, complementary to the control signal SWi.

The gain stage furthermore comprises a resistor Zi, whose value forms the value of the output impedance of the gain stage, connected between the module output SMDi and the module supply input EALMi.

As will be shown in more detail below, the selector circuit CSL is supplied with the output voltage present at the output terminal and the regulator unit 1 has a starting configuration in which each power path PTHi, connected to a supply voltage that is actually present, is on until the output voltage Vout reaches a threshold value allowing the selector circuit CSL to come into operation and select one of the power paths according to the selection criterion.

In this regard, each module MDi is configured, in this starting configuration, to turn on the corresponding output transistor MPgi.

To this end, as each output transistor MPgi is a PMOS transistor, each module comprises a pull-down circuit CPDi connected between the module output SMDi and ground GND.

More precisely, this pull-down circuit CPDi comprises a first NMOS transistor Ms1 connected between the module output SMDi and ground GND, a resistor Rs connected between the module supply input EALMi and the gate of the first transistor Ms1, and a second transistor Ms2, connected between the gate of the first transistor Ms1 and ground, whose gate, forming a control input for this pull-down circuit, is connected to the output terminal BS in order to receive, via the divider bridge PDV, the voltage aVout.

As will be shown in more detail below, during the starting phase, this circuit CPDi ensures that the signal Vgate_i is pulled to ground in the presence of the corresponding supply voltage, while the selector circuit is not operational, so as to turn on the output PMOS transistor MPgi during this starting phase.

Lastly, although this is not essential, the module MDi comprises a Miller compensator circuit, of conventional structure, connected between the drain and the gate of the module transistor Mfi.

This Miller compensator circuit CCMi comprises a capacitor CMi connected in series with a resistor RMi.

The Miller compensator circuit allows the stability of the feedback loop connecting the output terminal BS to the inverting input of the first stage ETE of the error amplifier AE to be improved.

The values of the capacitor CMi and of the resistor RMi are determined, in the conventional manner, according to the characteristics of the corresponding output transistor MPgi, the characteristics of the input stage of the error amplifier and the range of variations in the output load.

FIG. 4 is now referred back to in order to describe the architecture of the power stage ETP in greater detail.

This comprises as many power paths PTHi as there are potential supply sources and hence main supply inputs EALPi.

This power stage ETP is configured so as to allow direct management of these multiple power paths in order to select a single one thereof at the end of the starting phase, and to do this without using a conventional structure which would use a single power path in combination with multiple conventional switches allowing the desired supply voltage to be selected.

As the architecture of each power path is identical, only one of these power paths will be described here, e.g., the power path PTH1.

The power path PTH1 comprises the output transistor or gain transistor MPg1, which in this case is a PMOS transistor working in its saturation region with the substrate connected to the main supply input EALP1.

The power path PTH1 additionally comprises an auxiliary PMOS transistor MPp1, or protection transistor, connected as a diode (its gate is connected to its drain via a resistor R1). The reference DS1 denotes the substrate diode intrinsic to this transistor which plays a role in the operation of the transistor as a diode during the starting phase. This diode DS1 is on due to the connection of the substrate of the transistor MPp1 to the output terminal BS and, in the case of a PMOS transistor, it is formed by the P-doped drain area and the N-doped substrate area.

This auxiliary transistor MPp1 is connected between the output transistor Mpg1 and the output terminal BS and, when the power path is selected, it operates in its linear region with its substrate connected to the output terminal BS. In the starting phase it operates as a diode, as mentioned above.

This auxiliary transistor MPp1 is controllable on its gate via the resistor R1 (which allows the transistor to be connected as a diode) and via a drive transistor TCM1 that is itself controllable on its gate by a control signal SEL1 delivered by the selector circuit CSL.

In the example described here, among the four power paths PTH1-PTH4, one path, namely the path PTH1, is a high-voltage path dedicated to the supply VBUS, another path, namely the path PTH2, is a low-voltage path dedicated to the supply VBAT that is delivered by a battery, and the two other paths, namely the paths PTH3 and PTH4, are medium-voltage paths dedicated to auxiliary supplies VAUX1 and VAUX2.

Consequently, the single specific high-voltage component is the output transistor Mpg1, which is, for example, a power PMOS transistor of extended-drain type. All of the other PMOS transistors are conventional transistors that can be produced using CMOS technology.

In a conventional regulator architecture using a single power path in combination, for example, with four controllable switches that are intended to select one supply voltage from among four possible supply voltages, it would be necessary to have five power transistors, namely four power transistors for the four switches that are dedicated to the four possible supply voltages (regardless of whether or not the supply is a high-voltage supply) and one power transistor for the power path.

The invention therefore allows four power transistors to be saved in this case, thereby allowing the footprint of the regulator to be advantageously reduced.

Figures 7, 8:
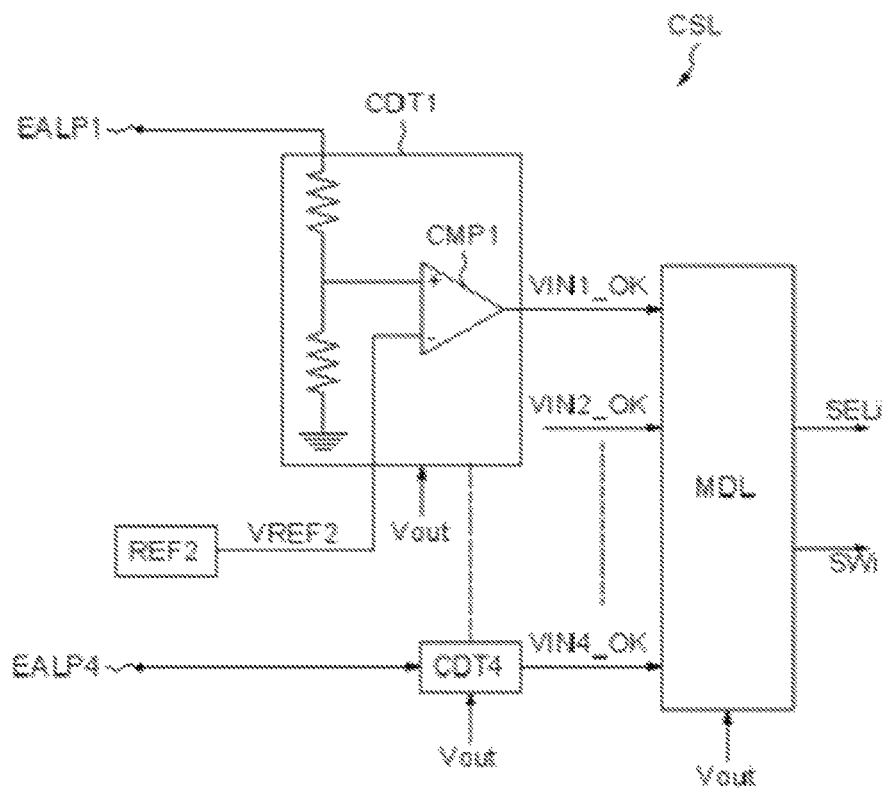
FIG. 7 illustrates a selector circuit of an embodiment of the invention.
FIG. 8 illustrates a table for use with embodiments of the invention.

FIG. 7 is now more particularly referred to in order to describe the structure of the selector circuit CSL.

The selector circuit CSL comprises multiple detector circuits CDT1-CDT4 that are coupled, respectively, to the main supply circuit EALP1-EALP4.

Each detector circuit CDTi is configured to detect the crossing of a threshold by the corresponding supply voltage that is potentially present at the main supply input EALPi and to deliver a detection logic signal VINi_OK that is representative of the crossing or non-crossing of this threshold.

Each detector circuit comprises a comparator CMPi whose non-inverting input is connected to the corresponding main supply input via a voltage divider bridge and whose inverting input receives a reference voltage VREF2 arising from a reference voltage source REF2.

This reference voltage VREF2 may be identical or different to the voltage VREF received on the non-inverting input of the input stage ETE of the error amplifier AE.

The various comparators CMP1-CMP4 are supplied with the voltage Vout that is available at the output terminal BS of the regulator.

Aside from the detector circuits CDTi, the selector circuit comprises a logic module MDL, also supplied with the voltage Vout, receiving all of the detection logic signals VINi_OK and configured to deliver, on the one hand, the control signals SELi to the control transistors TCMi (FIG. 4) and, on the other hand, the control signals SWi to the module MDi of the output stage ETS.

The control signals SELi and SWi together form selection signals allowing one of the power paths to be selected and the other paths to be "opened."

Each logic signal VINi_OK takes the value 1 when the supply voltage becomes higher than VREF2/b, where b is the division ratio of the associated divider bridge.

Otherwise, the logic signal VINi_OK keeps the value o.

The logic module MDL comprises a set of logic gates whose structure is defined based on the desired selection criterion, knowing that a single control signal SELi at a time must be active (equal to 1).

The selection criterion may be the following.

If a single supply voltage is present, this voltage must be selected.

If multiple supply voltages are present, the one having the lowest value will be chosen, thereby allowing the power consumed to be minimized.

An exemplary selection diagram is illustrated in FIG. 8, for which diagram it is assumed that the regulator 1 comprises three main supply inputs EALP1-EALP3 that are intended, respectively, to potentially receive the high supply voltage VBUS, the low supply voltage VBAT and a medium supply voltage VAUX.

In the starting phase, no supply voltage is yet present, and the three logic signals VIN1_OK, VIN2_OK and VIN3_OK are at 0, as are the three control signals SEL1-SEL3.

As soon as the voltage VAUX has crossed its threshold (VIN3_OK=1), then the logic module MDL is configured to confer the logic value 1 on the control signal SEL3 and the logic value 0 on the control signals SEL1 and SEL2 if the logic signal VIN2_OK is zero, and this occurs regardless of the logic value of the signal VIN1_OK.

Stated otherwise, the voltage VAUX will then be selected, regardless of whether this voltage is the only one present or it is simultaneously present along with the voltage VBUS, since the voltage having the lowest value is the one selected.

Likewise, as soon as the detection logic signal VIN2_OK takes the logic value 1, then the logic module MDL is configured to confer the logic value 1 on the control signal SEL2 and the logic value 0 on the control signals SEL1 and SEL3, and this occurs regardless of the logic value of the signals VIN1_OK and VIN3_OK.

Stated otherwise, this time it is the voltage VBAT that will be selected, regardless of whether it is alone or in the presence of the two other supply voltages, since it is the lowest voltage.

Lastly, in the presence of the logic signals VIN2_OK and VIN3_OK that are equal to 0, the control signal SEL1 will take the value 1 as soon as the detection logic signal VINi_OK takes the value 1, corresponding to the selection of the supply voltage VBUS, which is then considered to be the only supply available.

Additionally, as long as a control signal SELi is at 0, the signal SWi at o now opens the switch I1i (FIG. 6) while the signal/SWi is at 1, closing the switch I2i in order to connect the gate of the transistor Mfi to ground.

One mode of operation of the regulator according to the invention will now be described.

In the starting phase, all of the power paths are active, i.e., a power path is capable of conducting as soon as the corresponding supply voltage that is actually present at the input of this power path rises.

Specifically, considering the power path PTHi, as soon as the value of the supply voltage associated with this power path, initially at 0, increases, the pull-down circuit CPDi of the module MDi (FIG. 6) pulls the gate of the corresponding output transistor MPgi to ground (Vgate_i is pulled to 0).

Specifically, the voltage aVout present on the gate of the transistor Ms2 is not sufficient to turn this transistor on. This transistor is therefore off and the resistor Rs is chosen so that the voltage present at the gate of the transistor Ms1 is higher than the threshold voltage for turning this transistor on, consequently connecting the gate of the output transistor MPgi to ground.

The transistor MPgi is therefore on.

Additionally, although the auxiliary transistor MPpi is off because the corresponding control signal SELi is at 0, the current may flow through this transistor as it is connected as a diode.

Thus, as soon as a supply voltage rises, it starts to charge the output capacitor CL through the corresponding output transistor MPgi and through the diode of the auxiliary transistor MPpi.

The output voltage Vout then follows the difference between the value of this supply voltage reduced by the threshold voltage of the diode. Additionally, there is no risk of reverse current owing to the auxiliary transistor connected as a diode and the substrate diodes DSi of these auxiliary transistors arranged back to back.

As soon as the output voltage Vout reaches a threshold value, e.g., a threshold value that is equal to the value of a power-on reset system (e.g., between 1.2 and 1.5 volts), the selector circuit CSL supplied with this voltage Vout may operate and determine which path to select.

In this regard, the control signal SELi corresponding to the selected path takes the value 1, thereby turning on the control transistor TCMi (FIG. 4), which consequently pulls the gate of the auxiliary transistor MPpi to ground so as to turn it on fully.

Additionally, the transistor Ms2 of the module MDi turns on, thereby turning off the transistor Ms1. On the other hand, the signal SWi takes the value 1, thereby closing the switch I1i and opening the switch I2i, turning on the module transistor Mfi. The control loop is then active via the error amplifier AE. The gate of the transistor MPgi is pulled to a potential that guarantees regulation of the output voltage to the set voltage. It should be noted that this mechanism functions even if multiple supply voltages start at the same instant. Thus, as explained above, as long as the output voltage Vout has not reached its threshold, the selector circuit is inoperative but the paths corresponding to the supply voltages that are actually present, and which rise at the same time, are on and the output voltage Vout follows the highest supply voltage reduced by the threshold voltage of the diode. As soon as the output voltage Vout becomes higher than the threshold, the selector circuit operates and turns on the selected power path while opening the other power paths.

Additionally, as the regulator is in permanent operation, if, at a given instant, the configuration of the supply voltages that are present at the main inputs is altered, the selector circuit may select another supply voltage that is associated with another power path.

Figure 9:
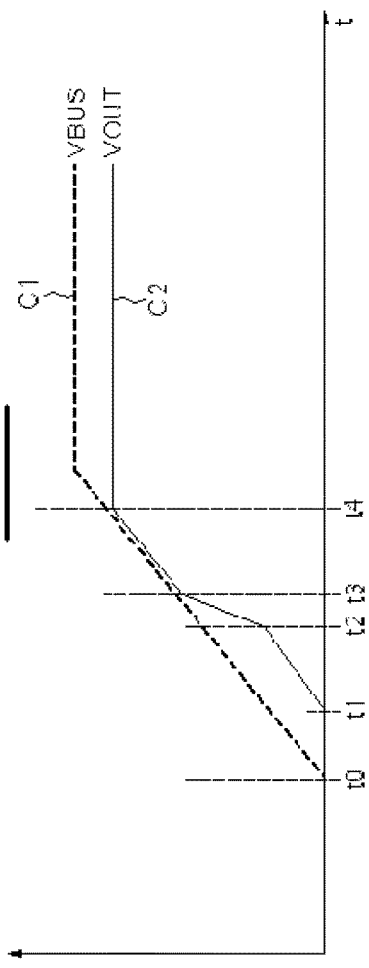
FIGS. 9 and 10 illustrate operation of embodiments of the invention.
Figure 10:
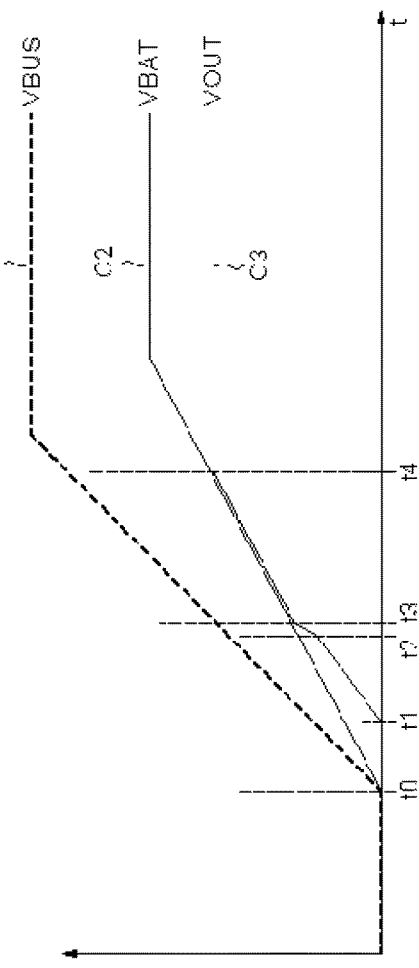

These operating mechanisms are illustrated by two examples (FIG. 9 and FIG. 10).

In FIG. 9, it is assumed that only the high voltage VBUS is present.

In FIG. 9, the curve C1 illustrates the evolution of the voltage VBUS over time, while the curve C2 illustrates the evolution of the output voltage Vout over time.

At instant to, the voltage VBUS starts to rise. Taking into account the transistor connected as a diode in the corresponding power path, the voltage Vout starts to rise at instant t1 in order to follow the voltage VBUS, give or take the diode threshold voltage.

Then, at instant t2, the output voltage Vout has reached its threshold, allowing the selector circuit to operate. This circuit then selects the power path associated with the voltage VBUS, thereby allowing the voltage Vout to rejoin the voltage VBUS at instant t3. Between instants t3 and t4, the voltage Vout rejoins the set voltage imposed by the reference voltage VREF (i.e., the set voltage equal to VREF/a), and beyond instant t4, there is the regulation phase.

In FIG. 10, it is assumed that the voltages VBUS and VBAT are simultaneously available.

In this FIG. 10, the curve C1 illustrates the evolution of the voltage VBUS over time, the curve C2 illustrates the evolution of the voltage VBAT over time and the curve C3 illustrates the evolution of the voltage Vout over time.

At instant to, the two voltages VBUS and VBAT start to rise.

Owing to the corresponding transistors connected as diodes, the voltage Vout follows the highest supply voltage, in this case the voltage VBUS, give or take the diode threshold value.

Then, at instant t2, the selector circuit comes into operation and selects the power path associated with the voltage VBAT, which is the lowest voltage.

The voltage Vout then rejoins, at instant t3, the voltage VBAT and then, between instants t3 and t4, follows this voltage VBAT until reaching the set value. The linear regulation phase occurs beyond instant t4.

In order to obtain high performance of the regulator (in terms of PSRR: power supply rejection ratio) under low dropout voltage conditions, it is recommended to keep the corresponding output transistor MPgi in its saturation region even under minimum supply conditions.

The operating conditions of the transistor are as follows:

$$Vt<Vgs<Vds+Vt.$$

This leads to a surface area of the transistor MPgi that is proportional to the inverse of the square root of the voltage drop. Thus, a large drop in voltage across the high-voltage transistor has a major impact on reducing the surface area.

A reduction in the footprint of the regulator by a factor of 2 to 3 with respect to a conventional architecture having a single power path is thus obtained.

The invention is not limited to the embodiments that have been described, but encompasses all variants.

Thus, instead of the pull-down circuit in the module MDi, a comparator configuration could potentially be used that would receive, on its non-inverting input, the supply voltage and, on its inverting input, a reference voltage. Additionally, other architectures are possible for the output stage ETS such as, for example, push-pull configurations or else the use of buffer stages.

That being so, the architecture described above has the advantage that when the supplies are present on starting, the selector circuit is off. Additionally, when the supplies are sufficient to supply the selector circuit (sufficient output voltage), the selector circuit couples the unused supplies (defined by the selection criterion) and retains only the supply intended to supply the USB controller.

Unknown states with open switches are thus avoided, thereby allowing safe and predictable startups.

Additionally, as the selector circuit is supplied by the output of the regulator, it does not have to handle high voltage, thereby simplifying its implementation (use of conventional transistors).

What is claimed is:

1. A low dropout voltage regulator unit, comprising:
   a plurality of main supply inputs that are each configured to receive a respective different supply voltage;
   an error amplifier;
   a power stage having an output terminal that is looped back to the error amplifier, the power stage configured to deliver an output current to a load, wherein the power stage comprises a plurality of power paths, each power path connected between a respective main supply input and the output terminal, wherein each power path is individually selectable and comprises an output transistor; and
   a selector circuit connected to the main supply inputs and configured to select one of the power paths according to a selection criterion, wherein the error amplifier comprises an output stage configured to selectively control the output transistor of the selected power path.

2. The regulator unit according to claim 1, wherein the error amplifier comprises an input stage having an input that is coupled to the output terminal and wherein the output stage comprises a plurality of modules that are assigned, respectively, to the power paths, each module being coupled to the output of the input stage, to the main supply input that is connected to a corresponding power path, and configured to control or not to control the output transistor of the corresponding power path based on a command from the selector circuit.

3. The regulator unit according to claim 2, wherein each module comprises:
   a module input coupled to the output of the input stage of the error amplifier;
   a module output coupled to a gate of a corresponding output transistor;
   a module supply input coupled to a corresponding main supply input; and
   a gain stage connected between the module supply input and ground and comprising a module transistor connected between the module output and a ground node, with a gate that is connected to the module input via first switch and to ground via a second switch, the first and second switches being controllable by two additional control signals delivered by the selector circuit.

4. The regulator unit according to claim 3, wherein each module comprises a Miller compensator circuit connected between a drain and the gate of the module transistor.

5. The regulator unit according to claim 1, wherein the selector circuit comprises a plurality of detector circuits that are coupled, respectively, to the main supply inputs, each detector circuit configured to detect a crossing of a threshold by a corresponding supply voltage and to deliver a detection logic signal that is representative of the crossing or non-crossing of the threshold, and a logic module configured to receive the detection logic signals and to deliver a selection signal that is representative of the power path selected according to the selection criterion.

6. The regulator unit according to claim 1, wherein the selection criterion corresponds to a supply voltage present that has the lowest value.

7. The regulator unit according to claim 1, wherein the error amplifier comprises an input stage having an input that is coupled to the output terminal and a supply input connected to the output terminal.

8. The regulator unit according to claim 1, wherein at least one of the output transistors comprises a power transistor.

9. A controller that is compatible with a USB Type-C standard, the controller incorporating the low dropout voltage regulator unit according to claim 1.

10. A low dropout voltage regulator unit, comprising:
    a plurality of main supply inputs that are each configured to receive a respective different supply voltage;
    an error amplifier;
    a power stage having an output terminal that is looped back to the error amplifier, the power stage configured to deliver an output current to a load, wherein the power stage comprises a plurality of power paths, each power path connected between a respective main supply input and the output terminal, wherein each power path is individually selectable and comprises an output transistor; and
    a selector circuit connected to the main supply inputs and configured to select one of the power paths according to a selection criterion, wherein the error amplifier comprises an output stage configured to selectively control the output transistor of the selected power path, wherein the selector circuit is supplied with an output voltage present at the output terminal, and the regulator unit has a starting configuration in which each power path, connected to a supply voltage that is actually present, is on until the output voltage reaches a threshold value allowing the selector circuit to select one of the power paths.

11. The regulator unit according to claim 10, wherein the output stage of the error amplifier comprises a plurality of modules that are assigned, respectively, to the power paths, each module being coupled to the output of an input stage of the error amplifier and having a respective module supply input coupled to the main supply input that is connected to a corresponding power path, wherein each module is configured to control or not to control the output transistor of the corresponding power path based on a command from the selector circuit, and wherein each module is configured, in the starting configuration, to turn on a corresponding output transistor.

12. The regulator unit according to claim 11, wherein each output transistor is a PMOS transistor having a substrate connected to a corresponding main supply input and each module comprises a pull-down circuit connected between a module output and a ground node and having a control input connected to the output terminal.

13. The regulator unit according to claim 12, wherein the pull-down circuit comprises:
    a first NMOS transistor connected between the module output and the ground node;
    a resistor connected between the module supply input and a gate of the first NMOS transistor; and
    a second NMOS transistor connected between the gate of the first NMOS transistor and ground, the second NMOS transistor having a gate that is connected to the output terminal.

14. The regulator unit according to claim 10, wherein each power path comprises a circuit that is controllable by the selector circuit, the circuit being configured to allow the power path to be selected or not to be selected and to turn the power path on during the starting configuration.

15. The regulator unit according to claim 14, wherein the controllable circuit comprises an auxiliary PMOS transistor having a substrate connected to the output terminal and a gate connected to the output terminal via a resistor, the auxiliary PMOS transistor being connected between the output transistor and the output terminal and being controllable on its gate via a drive transistor that is controllable by the selection circuit.

16. The regulator unit according to claim 10, wherein the error amplifier comprises an input stage having an input that is coupled to the output terminal;
    wherein the output stage comprises a plurality of modules that are assigned, respectively, to the power paths, each module being coupled to the output of the input stage, to the main supply input that is connected to a corresponding power path, and configured to control or not to control the output transistor of the corresponding power path based on a command from the selector circuit; and
    wherein each module comprises:
        a module input coupled to the output of the input stage of the error amplifier;
        a module output coupled to a gate of a corresponding output transistor;
        a module supply input coupled to a corresponding main supply input; and
        a gain stage connected between the module supply input and ground and comprising a module transistor connected between the module output and a ground node, with a gate that is connected to the module input via first switch and to the ground node via a second switch, the first and second switches being controllable by two additional control signals delivered by the selector circuit.

17. An electronic device comprising:
    a USB Type-C cable connector;
    a controller coupled to the connector via a voltage bus;
    an analog front end coupled to the controller;
    a digital core coupled to the analog front end;
    wherein the controller comprises a low dropout voltage regulator unit that comprises:
        a plurality of main supply inputs that are each configured to potentially receive a respective different supply voltage;
        an error amplifier;
        a power stage having an output terminal that is looped back to the error amplifier, the power stage configured to deliver an output current to a load, wherein the power stage comprises a plurality of power paths, each power path connected between a respective main supply input and the output terminal, wherein each power path is individually selectable and comprises an output transistor; and
        a selector circuit connected to the main supply inputs and configured to select one of the power paths according to a selection criterion, wherein the error amplifier comprises an output stage configured to selectively control the output transistor of the selected power path.

18. The device according to claim 17, further comprising a battery coupled to the controller.

19. The device according to claim 17, further comprising charge circuit having an AC input and a DC output coupled to the controller, the AC input configured to be connected to a mains power source.

20. The device according to claim 17, further comprising a second USB connector and a cable that electrically and physically connects the USB Type-C cable connector to the second USB connector, wherein the controller, the analog front end, and the digital core are located in the USB Type-C cable connector.

21. The device according to claim 20, wherein the second USB connector comprises a second USB Type-C cable connector and includes a controller that is of the same design as the controller of the USB Type-C cable connector.

* * * * *